United States Patent
Suto et al.

[11] Patent Number: 6,114,848
[45] Date of Patent: Sep. 5, 2000

[54] DIRECT-MEASUREMENT PROVISION OF SAFE BACKDRIVE LEVELS

[75] Inventors: Anthony J. Suto, Sterling; Robert J. Muller, Westford; John D. Moniz, Fall River, all of Mass.

[73] Assignee: GenRad, Inc., Westford, Mass.

[21] Appl. No.: 09/231,001

[22] Filed: Jan. 14, 1999

[51] Int. Cl.[7] .................................................. G01R 31/28
[52] U.S. Cl. ...................... 324/158.1; 324/754; 324/73.1; 324/73; 361/411; 361/412; 371/15.1; 371/16.1; 371/2.7; 714/724; 714/734
[58] Field of Search ................................ 324/158.1, 537, 324/538, 73.1, 73, 110; 371/15.1, 16.1, 27; 361/411, 412; 714/734, 724

[56] References Cited

U.S. PATENT DOCUMENTS 5,243,273  9/1993  Macauliffe et al. .................. 324/158.1

FOREIGN PATENT DOCUMENTS

0415319A2  6/1991  European Pat. Off. ........ G06F 11/22

*Primary Examiner*—Safet Metjahic
*Assistant Examiner*—Jimmy Nguyen
*Attorney, Agent, or Firm*—Cesari and McKenna, LLP

[57] ABSTRACT

Pin-driver circuitry in each of an automatic circuit tester (10)'s digital driver/sensor circuits (36) includes a current sensor ($R_{sense}$, QS1, QS2, D1, and D2) and comparison circuit (58) that indicate whether the load current supplied by the driver exceeds a level set by a threshold input (CURRENT_VALUE). The pin-driver circuitry also includes a timer (60) whose output indicates whether the comparison circuit's output has been asserted for a length of time that exceeds a limit set by a duration input (TIME_VALUE). When it has, the tester disables the driver and thereby prevents damage that could otherwise result from excessive backdrive durations that the test-generation process did not anticipate.

13 Claims, 5 Drawing Sheets

16,114,848

DIRECT-MEASUREMENT PROVISION OF SAFE BACKDRIVE LEVELS

BACKGROUND OF THE INVENTION

The invention is directed to printed-circuit-board testers and in particular to keeping "backdriving" within safe levels.

In so-called in-circuit testing, connections of an individual circuit-board component to its circuit-board traces are verified by applying and verifying the presence of predetermined sequences of signals on those traces. The tester must perform these tests with the board in a powered-up condition. Consequently, neighbor components can tend to drive some of the input terminals of the component under test to levels different from those that the test requires. To prevent this, the tester sometimes simply uses low-output-impedance drivers to drive the trace in question to the level opposite that to which the neighbor component attempts to drive it. This overpowering of on-board drive circuitry is known as backdriving.

Backdriving has a long history, but it has always been controversial. This is because it usually results in current flow that exceeds rated levels. If currents of those magnitudes flow for too long a time, they can damage circuit-board components. So some software used for designing and executing circuit tests has for years included provisions for determining when test steps will result in excessive backdriving. When the software detects such a step, it warns the designer or inhibits such steps' execution.

Such features have their uses, and they have been used by some test designers throughout essentially the entire history of automatic in-circuit testing. But their shortcomings have been apparent for just as long. This is because component variations complicate the test-design tool's job of ensuring that excessive backdriving is avoided. The test designer sets backdrive limits in terms of backdrive current and backdrive duration. To avoid excessive backdriving, the test-design tool must impose restrictions that ensure compliance with those limits not only for components with nominal characteristics but also for those that occupy the ends of the characteristics distributions expected of the types of component involved.

Unfortunately, the range of variations that can result from combinations of various component types' characteristics distributions makes it necessary to circumscribe the set of permissible test-signal bursts severely. This makes it difficult for the test designer to arrive at a test that the test-design tool accepts as complying with the supplied backdrive limits. The consequence all too often is that the test designer either dispenses with backdrive limits altogether or sets the backdrive limits to levels to which the components involved should not be subjected. If the resultant test does not cause damage on a few trial boards, it is adopted for routine use. Clearly, this approach to test design is not optimal. In the first place, damage is not always apparent initially; a test that appears to cause no damage can in fact introduce a latent defect. Additionally, different component lots have different characteristics, so a test can work perfectly well for awhile and then suddenly start to cause catastrophic defects.

SUMMARY OF THE INVENTION

We have recognized that this problem, which has long plagued the in-circuit-test field, can be solved simply by providing the tester with backdrive-limiting circuitry that senses and times driver load current so as to determine and report in real time whether durations of backdrive-level load currents have exceeded settable limits. This enables drive circuitry to react soon enough to avoid untoward consequences.

In accordance with the present invention, the backdrive-limiting circuit receives a time-value signal, which sets the maximum duration for which a backdrive-magnitude current can continuously be driven. There will be a range of backdrive currents whose continued use for too long a time should be prevented. But the backdrive-limiting circuitry can sense currents within the backdrive range without taking any action for a relatively long time, typically hundreds or thousands of clock intervals. If operation in that range does persist continuously for the maximum duration, though, the backdrive-limiting circuit interrupts it in some fashion, typically by placing the driver in a high-output-impedance state.

The test designer can therefore dispense with test-design tools' restrictive backdrive-limiting feature or adopt limits that are loose enough to permit the desired test-design freedom, because the present invention prevents the excessive backdriving that the resultant test would otherwise permit.

The present invention also adds another level of safety, one that even the strictest design rules do not afford. As a practical matter, test-design tools' features for preventing excessive backdriving must largely operate on the assumption that the board being tested is a good one, so they are unable to predict the excessive backdriving that can occur unpredictably in bad boards. But the present invention is based on real-time current measurement and timing, so it is able to prevent excessive backdriving even when it cannot be predicted.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
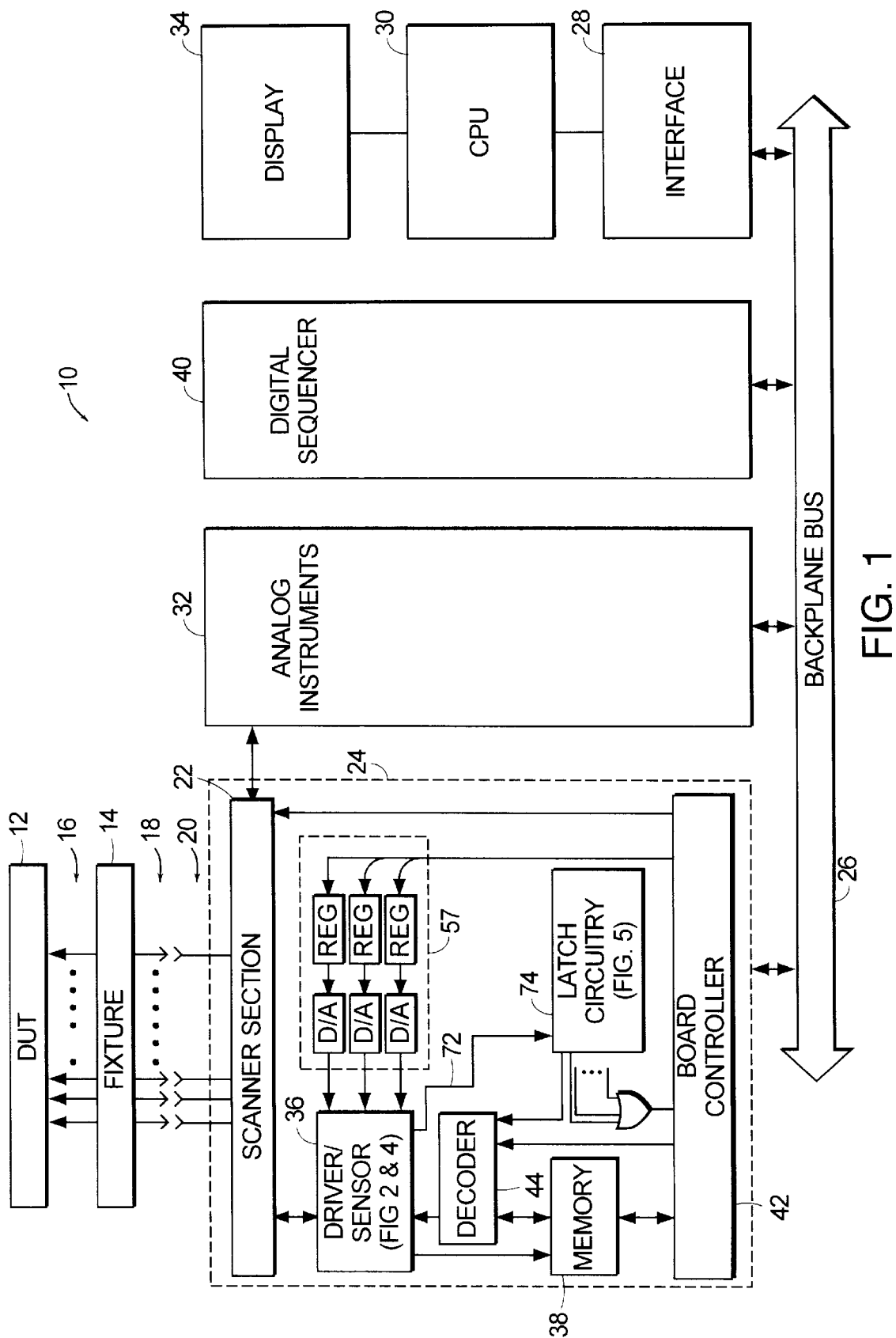
FIG. 1 is a block diagram of an automatic circuit tester that implements the present invention's teachings.

FIG. 1 shows in block-diagram form a test system 10 for testing a circuit board ("device under test") 12. A custom fixture 14 provides access to test points on the device under test 12. Board-side terminals, or "pins," 16 on the fixture 14 are so positioned as to enable them to make simultaneous contact with all of the board test points at which signals are to be applied or sensed in the course of a test. The board-side pins 16 are wired to system-side terminals 18 positioned to engage system terminals 20 of a multiplexor, or "scanner," comprising a plurality of scanner sections that respective pin boards may include. FIG. 1 depicts only a single scanner section 22 provided by a single pin board 24, but a test system more typically includes a plurality of such boards. One or more buses 26 typically connect the pin boards to the rest of the test system.

Through an appropriate interface 28, a central processing unit 30 communicates over bus 26 with analog instruments 32, such as voltmeters and signal generators, to program them for measuring and/or providing signals on test points through the scanner 22 and fixture 14. The instruments 32 may also employ the bus 26 to report measurement results to the central processing unit 30, and the central processing unit 30 may in turn employ a display 34 to provide a human-readable report.

In addition to making analog measurements, the system will also apply bursts of digital signals to various test points and digitally interpret resultant signals at other test points. For this purpose, several the pin boards 24 will include driver-sensor circuits such as circuit 36. Circuit 36's output port is coupled to a respective instrument-side scanner terminal that the scanner selectively couples to fixture-side scanner terminals so that circuit 36 can drive a test point and/or sense the signal on it. (Again, although FIG. 1 shows only a single such circuit, a typical digital circuit tester provides a large number of them, usually several to a pin board.)

A digital-signal test burst typically represents a relatively long sequence of binary values, and the typical high-performance tester includes a respective memory 38 dedicated to each driver-sensor. The memory is typically designed to afford rapid access, because the test burst's digital levels must often change at a high rate. A digital sequencer 40 supplies timing and address signals to the memory 38 through the bus 26 and a board controller 42.

In response to commands received before a test burst from the central processing unit 30, the pin board 24's controller circuitry 42 causes the scanner section 22's internal switches to connect the driver/sensor circuit 36's output port to the desired board test point through the associated system-side fixture terminal 18 and board-side pin 16. Also under control of the central processing unit 30, the controller 42 facilitates the loading of each pin memory 38 with the data required for a single signal burst.

The central processing unit 30 then commands the sequencer 40 to begin a burst. In response, the sequencer causes the pin memory 38 to produce output signals representing the contents of a sequence of pin-memory locations that the sequencer specifies. Each pin-memory location contains a code for one of the functions that the digital driver/sensor can perform. At a minimum, the possible functions are to drive the test point to the high logic level or the low logic level and to sense a high logic level or a low logic level, i.e., to report whether the sensed test point has assumed the expected signal level. The pin memory receives these reported results so that at the end of the burst it indicates whether the test node's responses to all inputs were as expected. Other codes indicate that the driver should be disabled ("tri-stated") or that the sensor should accept either level as correct. There may also be codes for repeating the previous function, toggling levels, and so forth.

Decoder circuitry 44 decodes the memory's output and, with an exception to be explained below, ordinarily complies with those codes in generating level signals that choose between the digital signal levels that the driver/sensor is to drive and/or consider correct. The driver/sensor operates in accordance with the sequence of decoder output signals, applying to the target test node a commanded sequence of logic levels and/or verifying that it exhibits expected signal levels.

Figure 2:
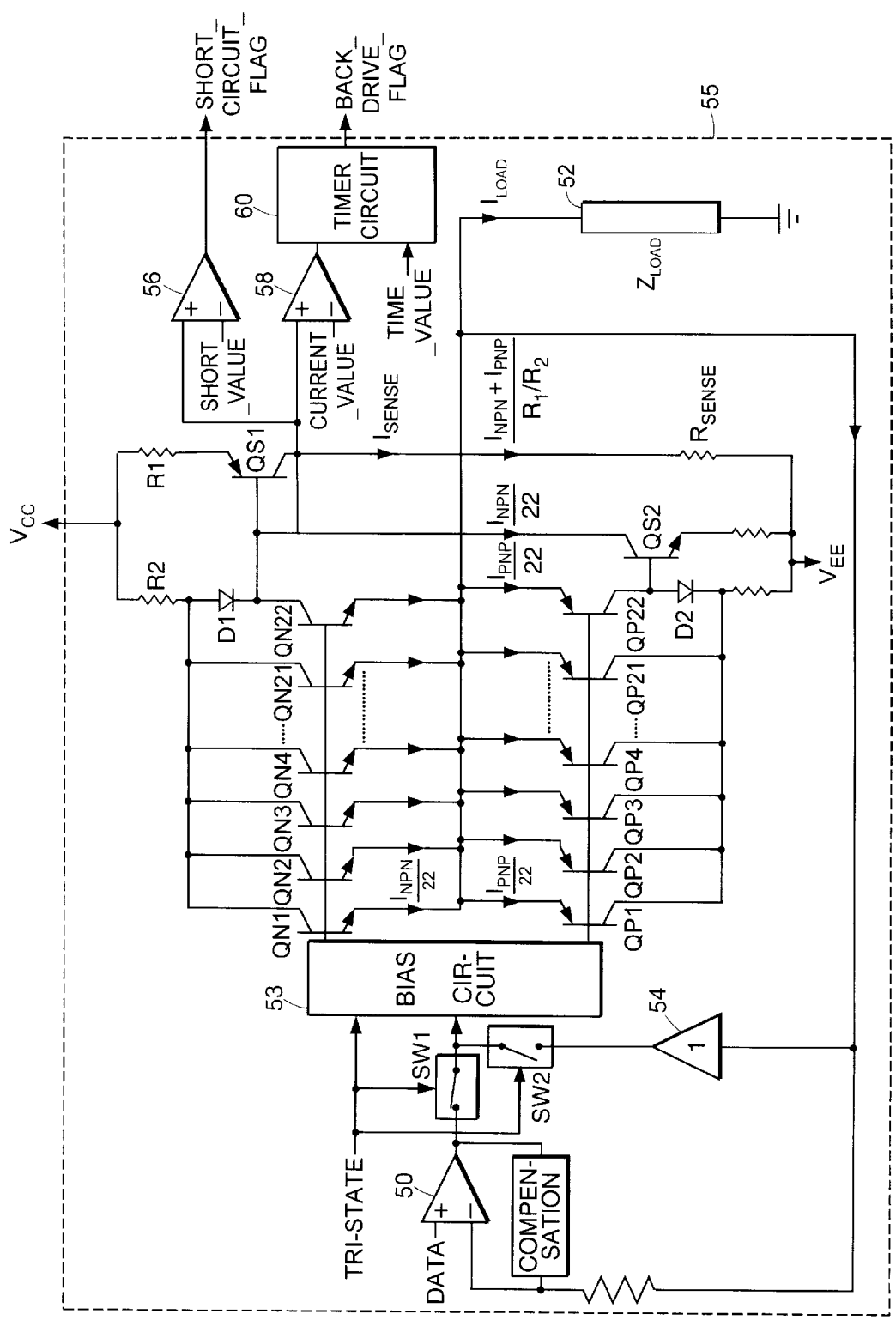
FIG. 2 is a simplified schematic diagram of pin-driver and backdrive-limiting circuitry that FIG. 1's tester employs.

Of particular interest in connection with the present invention is the driver/sensor 36's drive circuitry, which drives the load current, i.e., serves as a load-current source or sink. The particular type of digital driver circuitry of interest here is the type that is capable of "backdriving," i.e., of driving a load to one logic level despite some board device's attempt to drive it to the other logic level. FIG. 2 depicts in simplified form an example of a backdrive-capable digital driver. To drive the load-current magnitudes sometimes necessary for backdriving, the driver circuitry of FIG. 2 includes twenty-two NPN transistors QN1 through QN22 for sourcing load current and twenty-two PNP transistors QP1 through QP22 for sinking it.

When the code fetched from the pin memory specifies that the associated test point is to be driven, the decoder causes an analog multiplexor, not shown, to forward as the DATA signal one of two reference voltages. Amplifier 50 amplifies the difference between this level and the voltage on the load 52 and so applies the result through appropriate bias circuitry 53 to the bases of transistors QN1 through QN22 and QP1 through QP22 as to drive the load to the DATA signal's voltage level. When the fetched code indicates that the driver is not to be active, i.e., that it is to be tri-stated, the decoder asserts a TRI_STATE signal. That signal operates electronic switches SW1 and SW2 to states in which they isolate the drive transistors' bases from amplifier 50 and instead apply to them the output of a unity-gain buffer amplifier 54, which thereby keeps the drive transistors' base voltages equal to their emitter voltages. This keeps the drive transistors turned off but minimizes the delay encountered in turning them on again.

The tester architecture described so far is only one example of the type of board tester in which the teachings presently to be described can be practiced, and those skilled in the art will recognize that those teachings are applicable to tester architectures that vary significantly from this example. In particular, different embodiments' digital drivers may differ quite significantly from that of FIG. 2. But all will have some digital drivers that are capable of driving current levels needed for backdriving but dangerous to apply for too long a time.

The conventional response to this danger has been to design only test-signal bursts that should not result in excessive backdriving duration. But this approach has two drawbacks. One results from the fact that component specifications can vary from supplier to supplier and from lot to lot; the design constraints necessary to accommodate the combination of all worst-case good-component values often make it extremely difficult to design an effective test. The other drawback is that even a test that would prevent excessive backdriving in the worst-case good board can permit it on a bad board. So even the most-conservative test-design rules can still produce tests that cause excessive current drive.

With the approach about to be described, the test designer still will typically design the test with backdrive limitations, but these limitations will not have to be so strict as to accommodate all worst-case combinations. Instead, the test designer will can relax constraints enough to make an effective test and then rely on test-time detection of excessive overdriving to interrupt or otherwise limit the burst's backdriving if such over-driving occurs. The test designer can do this because of a mechanism that the illustrated embodiment implements in a current sensor and timer.

Figure 3:
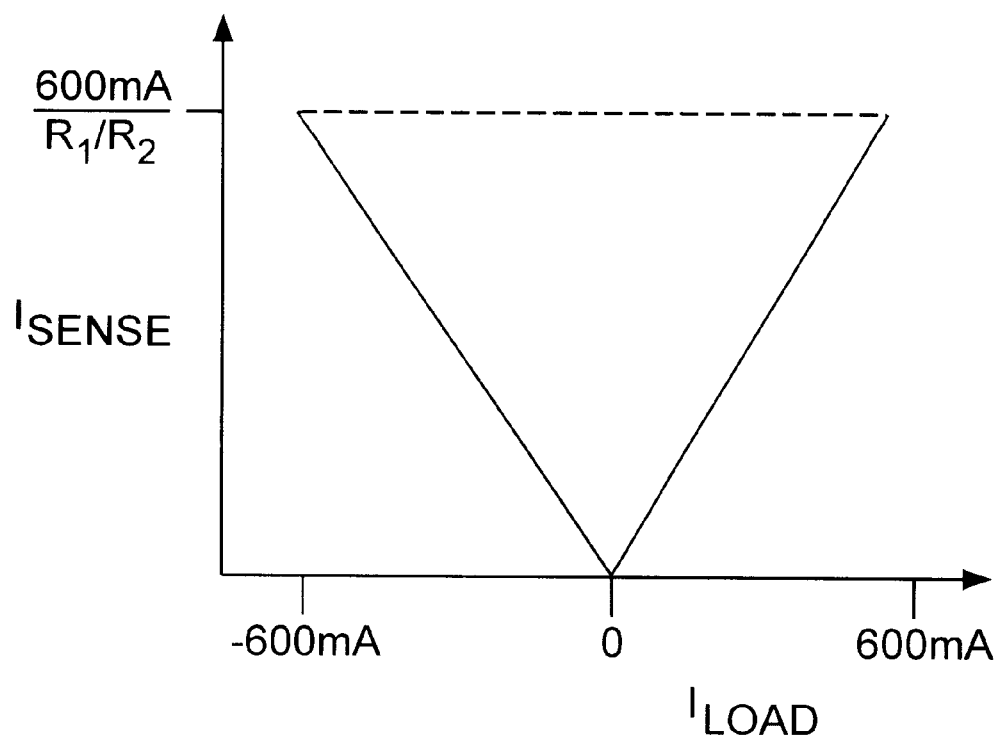
FIG. 3 is a plot of FIG. 2's sensor-circuitry output voltage as a function of load current.

We first consider the current sensor. The driver/sensor circuitry includes a current sensor that includes transistors QS1 and QS2, diodes D1 and D2, and a sensor output resistor $R_{sense}$. As will now be explained, these components cause a voltage across $R_{sense}$ that is proportional to the magnitude of the current that the driver sources or sinks: the $R_{sense}$ voltage bears the FIG. 3 relationship to the load current.

When the driver is sourcing current, the upper drive transistors QN1 through QN22 conduct, but the lower drive transistors do not. So no current flows through diode D2 in QP22's collector circuit, QS2 is turned off, and diode D1's current can flow only into QN22's collector. Now, all of the FIG. 2 circuitry except the load 52 is provided on the same integrated circuit 55, so its P-N junctions' characteristics can be matched very closely. Consequently, QS1's base-emitter junction voltage very nearly equals D1's. This means that resistor R1's current is proportional to R2's and, if QS1's base current can be neglected, to the total of the NPN drive transistors' collector currents. So QS1's collector current, and thus the sensor output voltage across $R_{sense}$, are proportional to the driver's output current.

When the driver operates to sink current rather than source it, the upper, NPN drive transistors are turned off, but the lower, PNP drive transistors are turned on. In that situation, D1's current can flow only through QS2, whose current is proportional to that of the PNP drive transistors just as QS1's is to that of the NPN drive transistors. So D1's and QS1's currents are again proportional to that of the drive transistors, and the $R_{sense}$ voltage is again indicative of the load-current magnitude.

In addition to using this sensor for back-drive limiting in a manner presently to be described, the illustrated embodiment also uses it to tell when the driver output is essentially shorted and should be turned off immediately to avoid damage. To this end, a comparator 56 asserts a SHORT_CIRCUIT_FLAG signal if the $R_{sense}$ voltage exceeds a threshold SHORT_VALUE set by FIG. 1's limit-setting circuitry 57. As will be explained presently, SHORT_CIRCUIT_FLAG's assertion results in the driver's immediately being tri-stated. Before a burst begins, the central processing unit 30 sets SHORT_VALUE as well as other analog values by communicating with the limit-setting circuitry 57 through the board controller 42. Circuit 57 includes registers that store analog representations of those values. It also includes digital-to-analog converters that convert the stored values to the required analog voltages.

Figure 4:
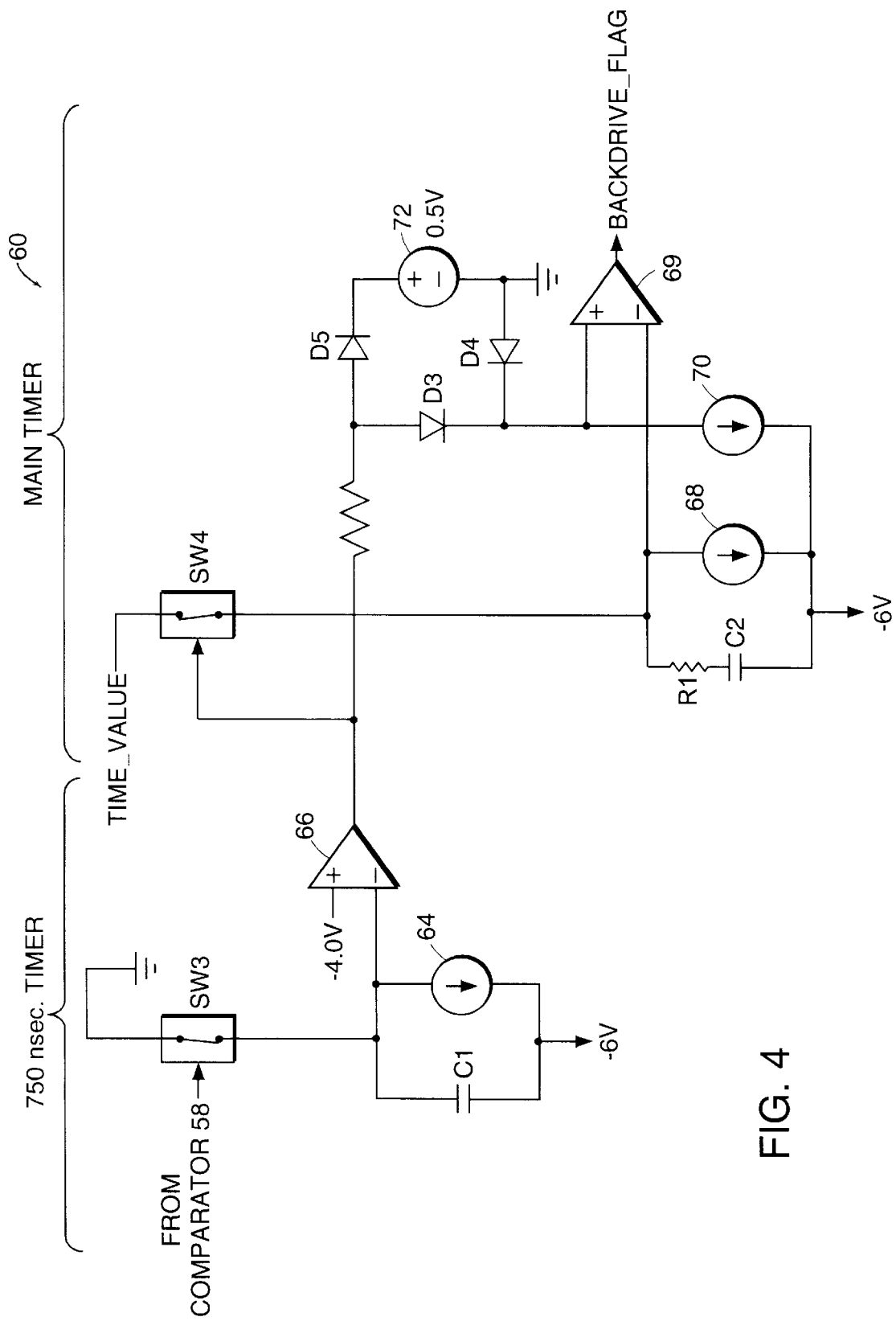
FIG. 4 is a simplified schematic diagram of a timer circuit included in the circuit of FIG. 2.

For back-drive limiting, a further comparator 58 compares the current-magnitude-indicating $R_{sense}$ voltage with a backdrive threshold CURRENT_VALUE generated by FIG. 1's limit-setting circuitry 57. When the sensor voltage across FIG. 2's $R_{sense}$ exceeds CURRENT_VALUE, comparator 58 asserts its output. This causes a timer 60, described in more detail in connection with FIG. 4, to begin measuring the backdrive current's duration. Timer 60 asserts its BACKDRIVE_FLAG output when comparator 58 has asserted its output for a period of time greater than a time limit represented by a TIME_VALUE voltage level that FIG. 1's level-setting circuitry 57 generates.

For a reason explained below, FIG. 2's timer circuit 60 divides its measured time interval into two sub-intervals. The first, relatively short sub-interval begins with the opening of FIG. 4's normally closed electronic switch SW3. The second, normally much longer sub-interval begins with the subsequent opening of a second normally closed electronic switch SW4 when the first sub-interval ends.

Specifically, the opening of SW3 in response to assertion of backdrive comparator 58's output permits a current source 64 to begin linearly discharging an interval-timing capacitor C1 toward −6 volts. After 750 nanoseconds, capacitor C1's upper terminal has fallen from ground potential, at which SW3 had held it when it was closed, to a potential of −4 volts. At that point a comparator 66's output switches from its unasserted, −6-volt level to its asserted, +1.2-volt level.

That assertion of comparator 66's output causes switch SW4 to open and permit a current source 68 to start linearly discharging another interval-timing capacitor C2. Before that assertion, capacitor C2's upper terminal, which provides the inverting input to a BACKDRIVE_FLAG-generating comparator 69, is held by FIG. 1's level-setting circuitry 57 at the duration-setting voltage level TIME_VALUE. (Capacitor C2 differs from the rest of FIG. 4's circuitry in that it typically is not included in FIG. 2's driver/sensor integrated circuit 55. Unlike capacitor C1, which is used for a very short-duration interval and is therefore small enough to be part of that integrated circuit, capacitor C2 is typically intended for durations as long as tens of milliseconds, so it is typically provided as a separate component.)

Comparator 69's non-inverting input is the voltage at the junction of two diodes D3 and D4. While comparator 66's output is still at its low, −6 volt level, D3 is back-biased, so comparator 69's non-inverting input is the −0.7 volt level that results from diode D4's being forward biased by a current source 70 and having its anode tied to ground. TIME_VALUE is always higher than −0.7 volt, so BACKDRIVE_FLAG is unasserted so long as switch SW4 is closed. This is as it should be, because assertion of BACKDRIVE_FLAG is an indication that the maximum backdrive duration has been exceeded.

When comparator 66's output goes high, the action of a 0.5-volt source 72 through a further diode D5 clamps D3's anode to 1.2 volts so that the diode drop across D3, which comparator 66's output now forward biases, results in a 0.5-volt level at the BACKDRIVE_FLAG comparator 69's non-inverting input port. Ordinarily, the TIME_VALUE level at which comparator 69's inverting input starts is higher than that, so BACKDRIVE_FLAG initially remains unasserted even though the backdrive threshold set by CURRENT_VALUE has been exceeded. But current source 68 causes capacitor C2 to discharge linearly from TIME_VALUE toward that 0.5-volt level. If the voltage on capacitor C2 reaches that level, comparator 69 asserts BACKDRIVE_FLAG and thereby indicates that backdriving should be interrupted.

The analog voltage TIME_VALUE thus sets the permitted backdrive duration. Specifically, so long as TIME_VALUE's voltage has been set to a value that exceeds 0.5 volt, the permitted backdrive duration τ is given by:

$$\tau = \frac{C_2}{I_{68}} (V_{TV} - 0.5 \text{ volt}) + 750 \text{ nsec},$$

where $V_{TV}$ is the voltage of the TIME_VALUE signal and $I_{68}$ is the current that current source 68 draws.

As this equation shows, the continuous-backdriving duration required to cause disablement depends only on the duration input TIME_VALUE. In other embodiments, though, it may additionally depend on other factors. For example, the quantity corresponding in some embodiments to source 68's discharge current may not be fixed, as it is in the illustrated embodiment; it may additionally depend on the backdrive current and/or other factors. In such a case, a greater backdrive current would result in a lower permitted backdrive duration. Such an arrangement can provide the backdrive and the short-circuit features in common circuitry. If the illustrated embodiment were modified to make current sensor 68's current depend on the difference between the $R_{SENSE}$ voltage and CURRENT_VALUE, for instance, the charging current may be so high when the short-circuit level is reached as to cause BACKDRIVE_FLAG essentially to be asserted immediately.

Also, the duration equation is based on the assumption that the backdriving is continuous. Of course, backdriving is more typically intermittent. When it is, the illustrated embodiment permits a greater cumulative backdrive time. Specifically, capacitor C2 is permitted to charge through resistor RI between backdriving intervals. The time required to draw off the resultant charge thereby adds to the cumulative backdrive time needed to reach BACKDRIVE_FLAG comparator 69's threshold.

As was mentioned above, the TIME_VALUE signal's voltage $V_{TV}$ is ordinarily set to exceed 0.5 volt. But there may be times when the tester is to operate in a different mode, one in which it is merely to record the occurrence of backdrive levels, not really to time them. For that purpose, the TIME_VALUE signal's voltage $V_{TV}$ is set to a value less than 0.5 volt. In that case, the transition of comparator 66's output to its high level after 750 nanoseconds causes comparator 69's BACKDRIVE_FLAG output to go high immediately: BACKDRIVE_FLAG is asserted if the backdrive level is present for as little as 750 nanoseconds. The 750-nanosecond duration tends to filter out current-sensor noise but captures even single-vector-duration backdrive conditions if the rate of vector application is as high as, say, 1 MHz.

Figure 5:
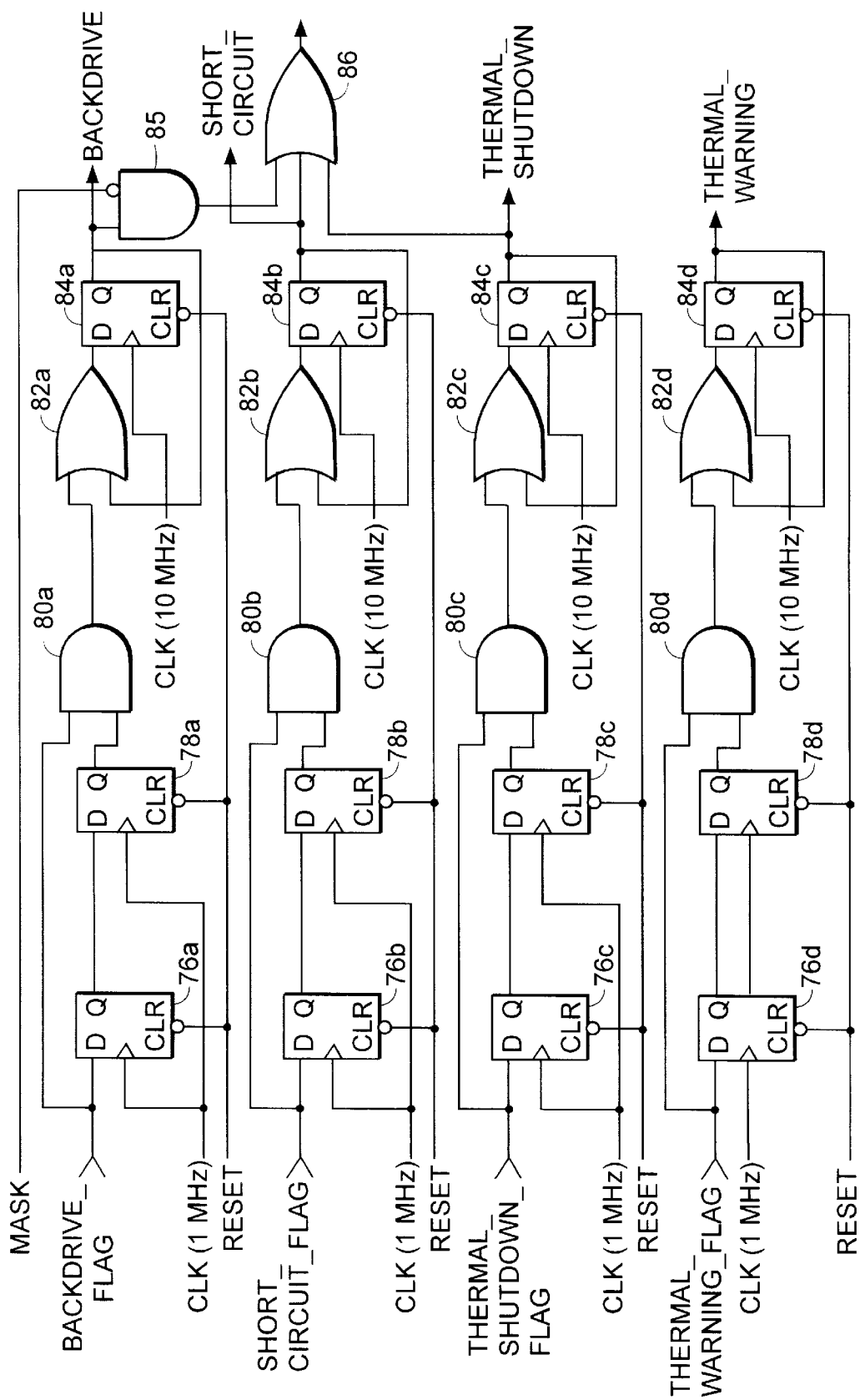
FIG. 5 is a logic diagram of a backdrive controller that FIG. 1's tester includes.

In some embodiments the pin memory, which ordinarily receives the digital-sensor outputs and stores their values, will additionally receive and store successive clock times' values of the BACKDRIVE_FLAG signal, possibly as de-glitched below. This provides information that the user or appropriate software can use for diagnostic purposes. In the illustrated embodiment, though, BACKDRIVE_FLAG signal merely accompanies the SHORT_CIRCUIT FLAG signal along FIG. 1's path 72 to latching circuitry 74, which implements FIG. 5's logic. (For the sake of explanation, FIG. 5 is a logic-diagram representation of the functions that the illustrated embodiment's latching circuitry is intended to implement. But such a circuit's human designers typically do not specify it at such a low level during actual implementation. Instead, they employ a high-level programming language such as VHDL to program a programmable logic device, so it is likely that the resultant circuit's details depart in various respects from what the drawing may suggest.) Part of that circuitry's purpose is to remember any of the flag signals' assertions until the CPU 30 has had a chance to poll it.

Specifically, the BACKDRIVE_FLAG signal is the input of a de-glitching circuit formed by FIG. 5's D-type flip-flops 76a and 78a and AND gate 80a. An OR gate 82a and a further D-type flip-flop 84a form a latch whose BACKDRIVE output assumes its asserted state when the de-glitched version of BACKDRIVE_FLAG becomes asserted. BACKDRIVE remains asserted when BACKDRIVE_FLAG thereafter returns to its unasserted state so that the CPU can check at its leisure for the backdrive occurrence.

The BACKDRIVE signal is an indication that the driver has been overdriving excessively and so should assume a backdrive-disabled mode. That mode can be implemented in a variety of ways in accordance with the invention. One way is simply to open a switch between the driver and the driven board node. Another way is to use a so-called foldback mechanism, in which the driver's output-current capability is reduced to below the backdrive range in a somewhat gradual fashion. The illustrated embodiment is an example of a third approach, in which the backdrive-disabled mode results from a use of the driver's tri-state feature.

Specifically, unless the CPU has caused a MASK signal to be asserted and thereby disable the backdrive-control feature, an AND gate 85 forwards the result to an OR gate 86. The decoder 44 (FIG. 1) receives gate 86's resultant asserted output. This causes the decoder to switch from its normal mode, in which the value of its TRI-STATE output (FIG. 2) is determined by the pin memory 38's output, to an excessive-backdrive mode, in which it asserts TRI-STATE even if the pin-memory output does not call for it to do so. As FIG. 2 indicates, this causes electronic switch SW3 to open and electronic switcher SW4 to close and thereby place the driver in its high-impedance state: the driver no longer drives the excessively backdriven node.

In some embodiments the pin memory, which ordinarily receives the digital-sensor outputs and stores their values, will additionally receive and store the BACKDRIVE_FLAG signal's values at successive clock times. This provides information that the user or appropriate software can use for diagnostic purposes.

FIG. 1's board controller 42 receives the ORed combination of this BACKDRIVE signal and those produced by the latching circuitry 74 (not shown) associated with the board's other driver/sensors. It can take any appropriate action in response, such as recording the event in a status register to which the central processor 30 has access by way of bus 26. Typically, the sequencer 40 receives the wired-OR combination of such a register's output and the corresponding outputs of other boards' backdrive controllers. The CPU 30 can detect the occurrence of excessive backdriving during the last signal burst by observing the resultant sequencer status and can then poll the board controllers' registers to find the pin or pins at which the excessive backdriving occurred and thereafter reset FIG. 5's BACKDRIVE latch by asserting flip-flop 84a's reset input.

Similar circuitry 76b, 78b, 80b, 82b, and 84b similarly de-glitches and latches the SHORT_CIRCUIT_FLAG signal and thereby generates a similar output SHORT_CIRCUIT, which similarly causes the driver to be disabled and can similarly be polled by the CPU.

Additionally, the integrated circuit in which the driver/sensor is implemented may include a temperature sensor, not shown in the drawings, that generates FIG. 5's THERMAL_SHUTDOWN_FLAG signal when the driver/sensor integrated circuit's temperature becomes excessive. Further circuitry 76c, 78c, 80c, 82c, and 84c generates a THERMAL_SHUTDOWN signal by de-glitching and latching THERMAL_SHUTDOWN_FLAG. THERMAL_SHUTDOWN causes the driver to be disabled, just as SHORT_CIRCUIT and BACKDRIVE do, and the CPU can similarly poll and reset it.

The temperature-sensor circuitry may also generate a further signal, THERMAL_WARNING_FLAG, to indicate that the driver/server has reached a lesser elevated temperature, which does not justify a shutdown but may make it prudent to take some other action. So circuitry 76d, 78d, 80d, 82d, and 84d, generates a THERMAL_WARNING signal by de-glitching THERMAL_WARNING_FLAG. This signal can be polled and reset, as the others can, but it does not cause the sensor's driver to be disabled.

Although the invention has been described by reference to a single example, it can be implemented in a wide range of embodiments. As was observed above, for example, the backdrive duration can instead be specified as, say, a function of the excess of the measured current level over the backdrive threshold. Also, although we believe that the illustrated analog timer is particularly well suited to implementing the invention, the specified durations could instead be timed out by, say, a digital down counter.

It is therefore apparent that the test-generation and -execution flexibility that the present invention permits can be afforded in a wide range of embodiments. The present invention thus constitutes a significant advance in the art.

What is claimed is:

1. An automatic circuit tester that includes:
   A) a plurality of backdrive-capable digital driver circuits, each backdrive-capable digital driver circuit including an output port and being adapted for application thereto of a code signal representing a sequence of choices of whether to drive a load coupled to the output port thereof and, if so, between two voltage levels to which the digital driver circuit can drive the load, the digital driver circuit being operable in a backdrive-enabled mode, in which the digital driver circuit drives the load in accordance with the code signal when doing so requires driving a load current within a backdrive current range, the digital driver circuit also being operable in a backdrive-disabled mode, in which the digital driver circuit refrains from driving the load to the voltage level selected by the code signal when doing so requires a load current within the backdrive current range; and
   B) a plurality of backdrive-limiting circuits, each backdrive-limiting circuit being associated with a respective different one of the digital driver circuits and adapted for application thereto of a time-value signal, each backdrive-limiting circuit sensing the load current driven by its associated driver circuit and operating its associated driver circuit in the backdrive-enabled mode when the load current thus sensed has not exceeded the backdrive-current range or occupied it for more than a continuous-backdrive duration that depends on the time-value signal, and operating its associated digital driver circuit in its backdrive-disabled mode when the current thus sensed has continuously occupied the backdrive-current range for the continuous-backdrive duration.

2. An automatic circuit tester as defined in claim 1 wherein each digital driver circuit includes:
   A) a pin driver, adapted for application thereto of a digital level signal that represents a sequence of choices between the two voltage levels and of an enablement signal that represents a sequence of choice of whether to drive the load, that drives the load to the level specified by the data signal when the enablement signal specifies that the pin driver is to drive the load and refrains from driving the load when the enablement signal specifies that the pin driver is not to; and
   B) a decoder circuit responsive to the code signal for so applying the digital level and enablement signals to the pin driver that when the digital driver circuit is in the backdrive-enable mode the enablement signal indicates that the pin driver is not to drive the load, and, when the digital driver circuit is in the backdrive-enable mode, the values of the level and enablement signals are those that the pin-data signals specify.

3. An automatic circuit tester as defined in claim 2 further including a scanner that includes a plurality of fixture-side scanner terminals connectable to loads on a circuit board, a plurality of instrument-side scanner terminals coupled to respective output ports of the digital driver circuits, and a matrix of switches operable to connect instrument-side scanner terminals to selected fixture-side scanner terminals.

4. An automatic circuit tester as defined in claim 2 further including a pin memory comprising a plurality of pin-memory locations that store respective test-vector-component values, for fetching data at successive clock intervals from a sequence of the pin-memory locations and applying to the digital driver circuit signals representative of the data thus fetched as the code signals.

5. An automatic circuit tester as defined in claim 4 further including a scanner that includes a plurality of fixture-side scanner terminals connectable to loads on a circuit board, a plurality of instrument-side scanner terminals coupled to respective output ports of the digital driver circuits, and a matrix of switches operable to connect instrument-side scanner terminals to selected fixture-side scanner terminals.

6. An automatic circuit tester as defined in claim 2 wherein, for at least a range of values of the time-value signal, the continuous-backdrive duration exceeds one millisecond.

7. An automatic circuit tester as defined in claim 1 further including a scanner that includes a plurality of fixture-side scanner terminals connectable to loads on a circuit board, a plurality of instrument-side scanner terminals coupled to respective output ports of the digital driver circuits, and a matrix of switches operable to connect instrument-side scanner terminals to selected fixture-side scanner terminals.

8. An automatic circuit tester as defined in claim 7 wherein, for at least a range of values of the time-value signal, the continuous-backdrive duration exceeds one millisecond.

9. An automatic circuit tester as defined in claim 7 further including a pin memory comprising a plurality of pin-memory locations that store respective test-vector-component values, for fetching data at successive clock intervals from a sequence of the pin-memory locations and applying to the digital driver circuit signals representative of the data thus fetched as the code signals.

10. An automatic circuit tester as defined in claim 1 further including a pin memory comprising a plurality of pin-memory locations that store respective test-vector-component values, for fetching data at successive clock intervals from a sequence of the pin-memory locations and applying to the digital driver circuit signals representative of the data thus fetched as the code signals.

11. An automatic circuit tester as defined in claim 10 wherein, for at least a range of values of the time-value signal, the continuous-backdrive duration exceeds one millisecond.

12. An automatic circuit tester as defined in claim 1 wherein, for at least a range of values of the time-value signal, the continuous-backdrive duration exceeds one millisecond.

13. An automatic circuit tester as defined in claim 1 wherein each backdrive-limiting circuit also operates its associated driver circuit in the backdrive-disabled mode in at least some circumstances in which the sensed current has neither exceeded the backdrive-current range nor occupied it continuously for the continuous-backdrive duration but has occupied it for a plurality of intervals whose durations together exceed the continuous-backdrive duration.

* * * * *

UNITED STATES PATENT AND TRADEMARK OFFICE
CERTIFICATE OF CORRECTION

PATENT NO : 6,114,848

DATED : September 5, 2000

INVENTOR(S) : Anthony J. Suto et al.

It is certified that error appears in the above-identified patent and that said Letters Patent is hereby corrected as shown below:

Column 9, line 44, "choice" should read "choices"; line 46, "data signal" should read "digital level signal"; line 53, "backdrive-enable" should read "backdrive-disabled"; line 55, "backdrive-enable" should read "backdrive-enabled"; line 57, "pin-data" should read "code".

Signed and Sealed this

Eighth Day of May, 2001

*Attest:*

NICHOLAS P. GODICI

*Attesting Officer*  *Acting Director of the United States Patent and Trademark Office*